(12) United States Patent
Huang et al.

(10) Patent No.: US 11,287,687 B2
(45) Date of Patent: Mar. 29, 2022

(54) DISPLAY PANEL HAVING REAL-TIME LIGHT INTENSITY CHANGE MANAGEMENT, METHOD FOR MANUFACTURING THE SAME AND METHOD FOR DRIVING THE SAME

(71) Applicant: BOE TECHNOLOGY GROUP CO., LTD., Beijing (CN)

(72) Inventors: Qingyu Huang, Beijing (CN); Zhiqiang Jiao, Beijing (CN); Huajie Yan, Beijing (CN); Juan Zhang, Beijing (CN); Xiaohu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 141 days.

(21) Appl. No.: 16/760,294

(22) PCT Filed: Dec. 12, 2019

(86) PCT No.: PCT/CN2019/124827
§ 371 (c)(1),
(2) Date: Apr. 29, 2020

(87) PCT Pub. No.: WO2020/119755
PCT Pub. Date: Jun. 18, 2020

(65) Prior Publication Data
US 2021/0223621 A1 Jul. 22, 2021

(30) Foreign Application Priority Data
Dec. 13, 2018 (CN) .......................... 201811523038.1

(51) Int. Cl.
*G02F 1/1335* (2006.01)
*H01L 27/32* (2006.01)
(Continued)

(52) U.S. Cl.
CPC .... *G02F 1/133553* (2013.01); *G02F 1/13338* (2013.01); *G09G 3/3208* (2013.01);
(Continued)

(58) Field of Classification Search
CPC ........... G02F 1/133553; G02F 1/13338; G02F 1/13318; G02F 1/1333; G09G 3/3208;
(Continued)

(56) References Cited

U.S. PATENT DOCUMENTS 10,379,676 B2 * 8/2019 Lee .................... G06F 3/0412
10,664,680 B2 5/2020 Xu et al.
(Continued)

FOREIGN PATENT DOCUMENTS

CN 101714327 A 5/2010
CN 104009060 A 8/2014
(Continued)

OTHER PUBLICATIONS

Office Action dated Apr. 21, 2020, issued in counterpart to CN Application No. 201811523038.1, with English translation. (15 pages).

*Primary Examiner* — Tracie Y Green
(74) *Attorney, Agent, or Firm* — Westerman, Hattori, Daniels & Adrian, LLP (57) ABSTRACT

A display panel, a method for manufacturing the same, and a method for driving the same are provided, the display panel includes a base substrate; a plurality of pixel units on the base substrate; and a controller, at least one pixel unit comprising: a light-emitting element; a reflective layer provided on a light output side of the light-emitting element and configured to receive and reflect light emitted by the light-emitting element to generate reflected light; and an optical sensor configured to receive the reflected light and measure a light intensity of the reflected light, wherein the controller (Continued)

is configured to adjust a light-emitting intensity of the light-emitting element based on the light intensity, wherein the light-emitting element comprises a light-emitting layer, an orthographic projection of the reflective layer on the base substrate does not overlap with an orthographic projection of the light-emitting layer on the base substrate.

20 Claims, 6 Drawing Sheets (51) Int. Cl.
| | |
|---|---|
| G09G 3/36 | (2006.01) |
| G09G 3/3208 | (2016.01) |
| H01L 51/52 | (2006.01) |
| G02F 1/1333 | (2006.01) |
| H01L 51/56 | (2006.01) |

(52) U.S. Cl.
CPC ........... *G09G 3/36* (2013.01); *H01L 27/3234* (2013.01); *H01L 51/5271* (2013.01); *H01L 51/56* (2013.01)

(58) Field of Classification Search
CPC .. G09G 3/36; G09G 2320/0233; G09G 3/006; G09G 2360/145; G09G 2320/046; G09G 2320/0626; H01L 27/3234; H01L 51/5271; H01L 51/56; H01L 27/3269; H01L 27/3227
See application file for complete search history.

(56) References Cited

U.S. PATENT DOCUMENTS

| | | | |
|---|---|---|---|
| 2007/0241998 A1 | 10/2007 | Fish et al. | |
| 2010/0085340 A1 | 4/2010 | Omoto et al. | |
| 2014/0240370 A1 | 8/2014 | Sakairi et al. | |
| 2017/0124984 A1* | 5/2017 | Wang | G02F 1/133553 |
| 2018/0350310 A1 | 12/2018 | Xiao et al. | |
| 2019/0050621 A1 | 2/2019 | Xu et al. | |
| 2019/0103063 A1* | 4/2019 | Liu | G09G 3/3648 |
| 2019/0214441 A1* | 7/2019 | Bu | H01L 27/3234 |
| 2019/0348006 A1 | 11/2019 | Arai et al. | |
| 2019/0386033 A1 | 12/2019 | Li et al. | |
| 2020/0212137 A1 | 7/2020 | Wang et al. | |

FOREIGN PATENT DOCUMENTS

| | | |
|---|---|---|
| CN | 106297679 A | 1/2017 |
| CN | 106886767 A | 6/2017 |
| CN | 108649059 A | 10/2018 |
| CN | 108831912 A | 11/2018 |
| CN | 109638047 A | 4/2019 |
| JP | 2018120175 A | 8/2018 |

* cited by examiner

DISPLAY PANEL HAVING REAL-TIME LIGHT INTENSITY CHANGE MANAGEMENT, METHOD FOR MANUFACTURING THE SAME AND METHOD FOR DRIVING THE SAME

CROSS-REFERENCE TO RELATED APPLICATION

This application is a Section 371 National Stage Application of International Application No. PCT/CN2019/124827, filed on Dec. 12, 2019, and claims the benefit of Chinese Patent Application No. 201811523038.1 filed on Dec. 13, 2018 in the National Intellectual Property Administration of China, the whole disclosure of which is incorporated herein by reference.

TECHNICAL FIELD

The present disclosure relates to the field of display technology, and in particular, to a display panel, a method for manufacturing the same, and a method for driving the same.

BACKGROUND

Generally, after the display panel is put into use, display defects may be caused due to defects or aging of the array substrate. In addition, as the using time of the display panel increases, aging degrees of different pixels may be different, which may also causes display defects.

SUMMARY

Some embodiments of the present disclosure provide a display panel, comprising: a base substrate; a plurality of pixel units on the base substrate; and a controller, at least one pixel unit comprising: a light-emitting element; a reflective layer provided on a light output side of the light-emitting element and configured to receive and reflect light emitted by the light-emitting element to generate reflected light; and an optical sensor configured to receive the reflected light and measure a light intensity of the reflected light, wherein the controller is configured to adjust a light-emitting intensity of the light-emitting element based on the light intensity, wherein the light-emitting element comprises a light-emitting layer, an orthographic projection of the reflective layer on the base substrate does not overlap with an orthographic projection of the light-emitting layer on the base substrate.

In some embodiments, the optical sensor is configured to receive the reflected light and measure a real-time light intensity of the reflected light, and the controller is configured to adjust the light-emitting intensity of the light-emitting element to be equal to an ideal intensity based on the real-time light intensity.

In some embodiments, the reflective layer comprises a Bragg reflective layer, and the Bragg reflective layer comprises multiple layers of metal compounds and cryolite which are alternately stacked in sequence.

In some embodiments, the optical sensor is provided on a side of the light-emitting element opposite to the light output side.

In some embodiments, an orthographic projection of the optical sensor on the base substrate does not overlap with the orthographic projection of the light-emitting layer on the base substrate. In some embodiments, a light output surface of the light-emitting element is parallel to the reflective layer, and in a first direction parallel to the base substrate, a distance between the light output surface of the light-emitting element and a center of the reflective layer is d, wherein, $0 < d \leq 200$ μm.

In some embodiments, in a second direction perpendicular to the base substrate, a distance between a light output surface of the light-emitting element and the optical sensor is h, wherein, $0 < h \leq 500$ μm.

In some embodiments, a light output surface of the light-emitting element is parallel to the reflective layer, an light intensity of light emitted by the light-emitting element and incident onto a center of the reflective layer is in a predetermined proportion to a central light intensity of light emitted by the light-emitting element, an incident angle of the light emitted by the light-emitting element and incident onto the center of the reflective layer is θ, a distance, in a first direction parallel to the base substrate, between a light output surface of the light-emitting element and the center of the reflective layer is d, and a distance, in a second direction perpendicular to the base substrate, between the light output surface of the light-emitting element and the optical sensor is h, wherein $2d/h = \tan^3 θ$).

In some embodiments, the display panel is a bottom-emission display panel, the light-emitting element comprises a first electrode, the light-emitting layer, and a second electrode which are sequentially arranged away from the base substrate, the first electrode is a transparent electrode, the second electrode is a non-transparent electrode, and the display panel further comprises: a resin layer between the base substrate and the first electrode; and a first planarization layer on a side of the second electrode away from the base substrate.

In some embodiments, the second electrodes in adjacent pixel units are connected to each other to form an integral electrode layer, and the integral electrode layer is provided with an opening so that light reflected by the reflective layer is allowed to pass through the opening to be incident onto the optical sensor.

In some embodiments, the optical sensor is embedded in the first planarization layer and located at a boundary of the first planarization layer away from the second electrode.

In some embodiments, the reflective layer is embedded in the resin layer and located at a boundary of the resin layer close to the first electrode.

In some embodiments, the reflective layer is embedded in the resin layer and located at a boundary of the resin layer away from the first electrode.

In some embodiments, the reflective layer is embedded in the resin layer, and is located between a boundary of the resin layer away from the first electrode and a boundary of the resin layer close to the first electrode.

In some embodiments, the display panel is a top-emission display panel, the light-emitting element comprises a first electrode, the light-emitting layer, and a second electrode which are sequentially arranged away from the base substrate, the second electrode is a transparent electrode, and the display panel further comprises: an interlayer dielectric layer between the base substrate and the first electrode; and a second planarization layer on a side of the second electrode away from the base substrate.

In some embodiments, the optical sensor is embedded in the interlayer dielectric layer and located at a boundary of the interlayer dielectric layer away from the first electrode.

In some embodiments, the reflective layer is embedded in the second planarization layer and located at a boundary of the second planarization layer away from the second electrode.

In some embodiments, the reflective layer is embedded in the second planarization layer, and is located between a boundary of the second planarization layer away from the second electrode and a boundary of the second planarization layer close to the second electrode.

Some embodiments of the present disclosure provide a method for manufacturing a display panel, comprising: forming a plurality of pixel units on a base substrate, and providing a controller, the step of forming at least one pixel unit comprises: forming a light-emitting element; forming a reflective layer on a light output side of the light-emitting element; and forming an optical sensor, wherein the reflective layer is configured to receive and reflect light emitted by the light-emitting element to generate reflected light, the optical sensor is configured to receive the reflected light and measure a light intensity of the reflected light, and the controller is configured to adjust a light-emitting intensity of the light-emitting element based on the light intensity, wherein the light-emitting element comprises a light-emitting layer, an orthographic projection of the reflective layer on the base substrate does not overlap with an orthographic projection of the light-emitting layer on the base substrate.

Some embodiments of the present disclosure provide a method for driving a display panel, the display panel comprising: a base substrate; a plurality of pixel units on the base substrate; and a controller, at least one pixel unit, comprising: a light-emitting element comprising a light-emitting layer; a reflective layer provided on a light output side of the light-emitting element and configured to receive and reflect light emitted by the light-emitting element to generate reflected light, wherein an orthographic projection of the reflective layer on the base substrate does not overlap with an orthographic projection of the light-emitting layer on the base substrate; and an optical sensor, wherein the method comprises: driving the light-emitting element to emit light; receiving the reflected light and measuring a light intensity of the reflected light by using the optical sensor; and adjusting a light-emitting intensity of the light-emitting element based on the light intensity by using the controller.

DETAILED DESCRIPTION OF THE EMBODIMENTS

Embodiments of the present disclosure are described in detail below. The embodiments described below are exemplary, and are only for explaining the present disclosure, and should not be construed as limiting the present disclosure. If no specific technology or conditions are indicated in the embodiments, the technology or conditions described in the literature in the art or the product specification shall be followed. The used reagents or instruments which do not indicate manufacturers are all conventional products that are commercially available.

In the related art, the method to solve the above-mentioned display defects is mainly to use a charge-coupled device (CCD) to perform a pixel-level accurate optical calibration directly after the gamma debugging is performed, when the display panel is shipped from the factory. In addition, external circuit compensation may be performed on an external circuit of the display panel to compensate for shift of Vth (threshold voltage). However, none of these methods may achieve real-time measurement of the light intensity change of each pixel of the display panel, which may not make the display panel to achieve a better display performance after being used for a long time.

Figure 1:
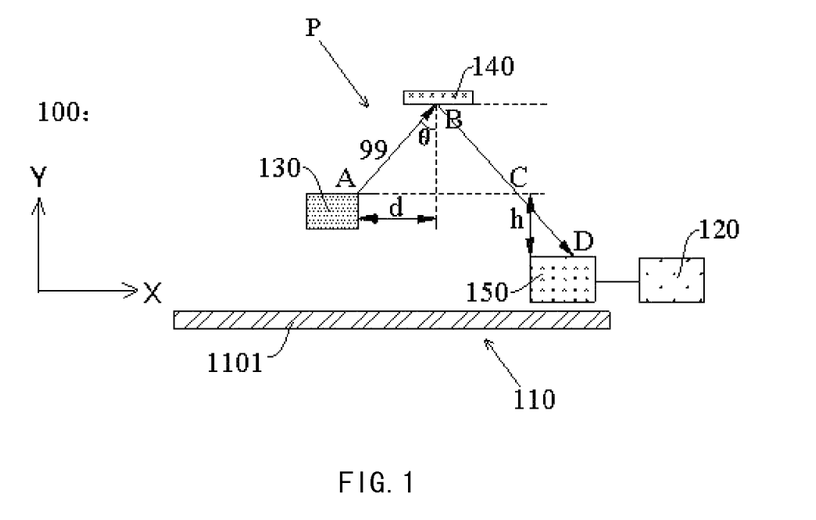
FIG. 1 shows a schematic view of an optical path for test light of a light-emitting element in a display panel according to some embodiments of the present disclosure.
Figure 2:
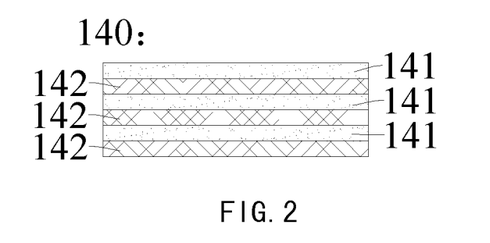
FIG. 2 shows a schematic cross-sectional structural view of a Bragg reflective layer according to some embodiments of the present disclosure.

In one aspect of the present disclosure, some embodiments of the present disclosure provide a display panel. According to some embodiments of the present disclosure, referring to FIG. 1, the display panel 100 includes an array substrate 110 and a controller 120. The array substrate 110 includes a base substrate 1101 and a plurality of pixel units P disposed on the base substrate 1101 (It should be noted that, for convenience of description, only one pixel unit is shown in FIG. 1; in addition, in order to clearly show the optical path of the test light in the display panel 100, only a part of the pixel unit is shown in FIG. 1. Those skilled in the art may understand that in addition to structures shown in the figure, the display panel 100 also has other structures). At least one pixel unit P includes a light-emitting element 130, a reflective layer 140 provided on a light output side of the light-emitting element and configured to receive and reflect light (i.e. test light) emitted by the light-emitting element to generate reflected light, and an optical sensor 150 configured to receive the reflected light and measure a light intensity of the reflected light. The controller 120 is electrically connected to the optical sensor 150. As shown in FIG. 1, the reflective layer 140 is disposed on the light output side of the light-emitting element 130 and is parallel to a light-emitting surface of the light-emitting element 130. The emergent light 99 emitted by the light-emitting element 130 is reflected by the reflective surface 140 toward the optical sensor 150. In this embodiment, the optical sensor 150 may be used to measure the real-time intensity of the reflected light, and the controller 120 is used to adjust an light-emitting intensity of the light-emitting element 130 to be close to an ideal intensity according to the real-time intensity, that is, to adjust the light-emitting intensity of the light-emitting element 130 to be substantially equal to the ideal intensity. For example, when the ratio of the difference between the light-emitting intensity of the light-emitting element 130 and the ideal intensity to the ideal intensity is less than a predetermined threshold, for example, 1%, it may be considered that the light-emitting intensity of the light emitting element 130 is equal to the ideal intensity. Since the optical sensor 150 of the display panel 100 may measure the real-time intensity of the reflected light, the light emitted from the light-emitting element 130 of the pixel unit in the display panel 100 may be compensated in real time, which overcomes the drawback that the display panel 100 has a poor display performance due to aging or defects during the operation process. As a result, the display panel 100 may still achieve a better display performance after being used for a long time.

In the manufacturing process of the display panel, the optical sensor 150 is usually bulky and difficult to be disposed on the light output side of the light-emitting element 130. In the embodiments, the reflective layer 140 with a relatively small volume is provided on the light output side of the light-emitting element 130. The reflective layer 140 with a relatively small volume reflects the emergent light toward the optical sensor 150 with a relatively large volume, which makes the structure of the display panel 100 simple without changing the overall structure of the display panel 100, and which is easy to implement in the process and easy for industrial production.

According to some embodiments of the present disclosure, the reflective layer 140 is added to the structure of the display device 100 so that the emergent light emitted from the light-emitting element 130 is directed to the optical sensor 150, and then the light-emitting intensity of the light emitting device 130 is adjusted to be close to the ideal intensity according to the real-time intensity of the received reflected light measured by the optical sensor 150. In this paper, the measured real-time intensity of the received reflected light is related to the actual intensity of the light emitted by the pixel unit P at a certain gray scale at a certain display time of the display panel. The real-time intensity of the received reflected light may be measured to represent the real-time intensity of the light emitted by the pixel unit P (hereinafter also referred to as the real-time intensity of the pixel unit P). The ideal intensity refers to the ideal intensity of the light emitted by the pixel unit P (hereinafter also referred to as the ideal intensity of the pixel unit P) at the gray scale when the display panel is displaying. The ideal intensity can be understood as the intensity of light emitted by the pixel unit P at the gray scale when the display panel 100 is not aging (i.e., immediately after shipped from factory).

According to the embodiments of the present disclosure, ideally, the real-time intensity of the pixel unit P described above is equal to the ideal intensity. However, after the display panel is put into use, display defects may be caused due to defects or aging of the array substrate, in addition, as the using time of the display panel increases, aging degrees of different pixels may be different, which may also causes display defects. In this case, the real-time intensity of the pixel unit P is different from the ideal intensity. In some embodiments of the present disclosure, the real-time intensity of the reflected light may be measured by the optical sensor 150, thus the light emitted from the light-emitting element 130 of the pixel unit in the display panel 100 may be compensated in real time, which overcomes the drawback that the display panel 100 has a poor display performance due to aging or defects during the operation process. As a result, the display panel 100 may still achieve a better display performance after being used for a long time. In addition, since the reflective layer 140 with a relatively small volume provided on the light output side of the light-emitting element 130, the reflective layer 140 with a relatively small volume reflects the emergent light to the optical sensor 150 which has a relatively large volume and is difficult to be disposed on the light output side of the light-emitting element 130 inside the structure of the display panel. It makes the structure of the display panel 100 simple without changing the overall structure of the display panel 100, and it is easy to implement in the process and easy for industrial production.

According to some embodiments of the present disclosure, the display device 100 may be an OLED (organic light-emitting diode) device, an LCD (liquid crystal display device), a MICRO-LED display device, or the like. The solutions in the present disclosure have a wide range of applications and are easy to industrialize.

According to some embodiments of the present disclosure, referring to FIG. 1, the position of the optical sensor 150 may be disposed on a side of the light-emitting element 130 facing away from the light output side, that is, the side of the light-emitting element 130 opposite to the light output side. Therefore, even if the optical sensor 150 is added to the display device 100, there is no need to change the original structure of the display device 100, which is easy to realize in process and easy to industrialize.

According to some embodiments of the present disclosure, referring to FIGS. 1 and 4 to 8, the light-emitting element 130 may be an electroluminescent diode, such as an organic light-emitting diode. The light-emitting element 130 includes a light-emitting layer 133. The reflective layer 140 is parallel to a light output surface of the light-emitting element 130. An orthographic projection of the reflective layer 140 on the base substrate 1101 does not overlap with an orthographic projection of the light-emitting layer 133 of the light-emitting element 130 on the base substrate 1101, and an orthographic projection of the optical sensor 150 on the base substrate 1101 does not overlap with the orthographic projection of the light-emitting layer 133 of the light-emitting element 130 on the base substrate 1101. Thus, the reflective layer 140 is provided in the display device 100 so that the light emitted from the light-emitting element 130 is directed to the optical sensor 150 without affecting the normal light emission of the light-emitting element 130. Therefore, on the basis of enabling the technical effect of the light-emitting intensity compensation of the present disclosure, the display performance of the display device 100 itself will not be affected, and the display device 100 may still realize normal display with good display performance, and is suitable for industrialization.

In some embodiments of the present disclosure, by adding a reflective layer 140 into the display device 100, and the emergent light 99 emitted from the light-emitting element 130 is reflected by the reflective layer 140 toward the optical sensor 150. When the emergent light 99 is emitted from the light-emitting element 130 to the optical sensor 150, it may also pass through other structures in the display device 100, such as a pixel defining layer, etc., and these structures in the display device 100 may absorb the emergent light 99 to a certain extent, which may cause the real-time intensity of the reflected light measured by the optical sensor 150 to be less than the real-time intensity of the emergent light 99 actually emitted by the light-emitting element 130. Thus, some deviations may occur when adjusting the optical intensity, as a result, the controller 120 excessively adjusts the intensity of the emergent light 99 emitted by the light emitting element 130, so that the light-emitting intensity of the light-emitting element 130 is greater than the ideal intensity. Although the deviations here are usually negligible, in order to minimize such adjustment deviations, the inventor has optimized the positions of the reflective layer 140 and the optical sensor 150 in the display device 100, so that the light path of the emergent light 99 in the display device 100 is the shortest, which in turn makes the adjustment of the light emitting element 130 by the controller 120 achieve the best effect, thereby enhancing the display quality.

According to some embodiments of the present disclosure, the emergent light inclined relative to the light output surface of the light-emitting element 130 is used as the light incident onto the reflective layer 140 for measuring the real-time intensity. FIG. 1 shows a schematic view of the light path of the emergent light. Referring to FIG. 1, an light output point of the emergent light 99 on the light-emitting element 130 is named A; an incident point of the emergent light 99 on the reflective layer 140 is named B (for example, the center of the reflective layer 140); an incident point of the emergent light 99 on the optical sensor 150 is named D; the point which is located on the line segment BD and a distance between which and the reflective layer 140 is the same as a distance between point A and the reflective layer 140 is named C; and an incident angle of the emergent light 99 toward the reflective layer 140 is named θ. In addition, the length of each line segment is set, AB=BC=x; CD=y.

According to some embodiments of the present disclosure, referring to FIG. 1, the inventor conducted an careful study on distances between various structures or components in the display device 100. The inventor found that in the display device 100 described in the present disclosure, both a distance d (i.e. a distance between the light output surface of the light-emitting element 130 and the center of the reflective layer 140 in a first direction X parallel to the base substrate 1101) between the light output point A of the emergent light 99 on the light-emitting element 130 and the normal (it should be noted that the "normal" here refers to a physical normal, i.e., a straight line passing through the incident point and perpendicular to a mirror surface, and those skilled in the art may understand that the reflective layer 140 in the present disclosure is the "mirror surface" here) of the incident point B of the emergent light 99 on the reflective layer 140 and a distance h between the light output surface of the light-emitting element 130 and the optical sensor 150 in the vertical direction (it should be noted that the vertical direction here refers to a direction perpendicular to the display screen when the display device 100 is in use) have a great influence on the real-time intensity measured by the optical sensor 150. The distance h described above is a distance between the light output surface of the light-emitting element 130 and the optical sensor 150 in a second direction Y perpendicular to the base substrate 1101. When changing the value of d and the value of h, the real-time intensity of the reflected light measured by the optical sensor 150 is obviously different. In some embodiments, the inventor has optimized the value of d and the value of h. The inventor found that when distance between the light output point A of the emergent light 99 on the light-emitting element and the normal of the incident point B of the emergent light on the reflective layer 140 satisfies 0<d≤200 μm, specifically, it may be 1 μm, 2 μm, 5 μm, 10 μm, 20 μm, 50 μm, 100 μm, 150 μm or 200 μm, etc., or when the distance between the light output surface of the light-emitting element 130 and the optical sensor 150 in the vertical direction satisfies 0<h≤500 μm, specifically, it may be 1 μm, 2 μm, 5 μm, 10 μm, 20 μm, 50 μm, 100 μm, 150 μm, 200 μm or 500 μm, etc., the absorption of the intensity of the emergent light 99 by various structures and components in the display device 100 can be minimized, so that the optical path the emergent light 99 in the display device 100 is the shortest, as a result, the aforementioned adjustment deviation reaches the minimum value, and then the adjustment of the light-emitting element 130 by the controller 120 achieves the best result, thereby enhancing the display quality.

According to an embodiment of the present disclosure, as described above, the emergent light 99 inclined with respect to the light output surface of the light-emitting element 130 is used as the light incident onto the reflective layer 140 for measuring the real-time intensity, and the light intensity of the emergent light 99 needs to be a predetermined ratio to a central intensity of the light emitted by the element 130, for example, the intensity of the emergent light 99 is 80% of the central intensity of the light emitted by the light-emitting element 130. If the ratio of the light intensity of the emergent light 99 to the central light intensity of the light emitted by the light emitting element 130 is too low, in the subsequent optical path, the loss of the emergent light during the travel in the display panel 100 may not be ignored relative to the light intensity of the emergent light 99, which may affect the subsequent real-time intensity measurement result. For a certain display device 100, when the structure and material of the light-emitting element 130 are determined, the light intensity distribution of the light emitted from the light output surface is determined, the output angle of the light whose intensity is at a predetermined ratio to the central intensity of the light emitted by the light emitting element 130 and which is incident onto the reflective layer 140 for measuring the real-time is determined. The incident angle θ of the light (i.e., emergent light 99) incident onto the reflective layer 140 is determined. The distance d between the light output point A of the emergent light 99 on the light-emitting element 130 and the normal of the incident point B of the emergent light 99 on the reflective layer 140 and the distance h of the light output surface of the light-emitting element 130 and the optical sensor 150 in the vertical direction may be adjusted to make the light path of the emergent light 99 in the display device 100 the shortest, so that the adjustment of the light-emitting element 130 by the controller 120 achieves the best result, thereby enhancing the display quality.

According to some embodiments of the present disclosure, referring to FIG. 1, the inventor of the present disclosure creatively established an optical path function model $f(x, y)=2x+y$ of the emergent light 99 in order to further explore the optimal setting positions of the reflective layer 140 and the optical sensor 150. The optical path of the emergent light 99 is a function of x and y. In other words, the problem of seeking the minimum value of the optical path of the emergent light 99 is converted into a mathematical problem of solving the minimum value of the function $f(x, y)=2x+y$.

According to some embodiments of the present disclosure, referring to FIG. 1, according to the basic relationship of plane geometry, the aforementioned line segments AB=BC=x=d/sin θ; the line segment CD=y=h/cos θ. The optical path function model $f(x, y)=2x+y$ of the aforementioned emergent light 99 is converted to $f(\theta)=2d/\sin\theta+h/\cos\theta$, $\theta \in (0, \pi/2)$. That is, the problem of finding the minimum value of the optical path of the emergent light 99 is converted into a mathematical problem of finding the minimum value of the function $f(\theta)=2d/\sin\theta+h/\cos\theta$ in the range of $(0, \pi/2)$.

According to some embodiments of the present disclosure, since $f(\theta)=2d/\sin\theta+h/\cos\theta$, the derivative function of the function $f(\theta)$ is $f'(\theta)=-2d\cos\theta/\sin^2\theta+h\sin\theta/\cos^2\theta$. Given $f'(\theta)=-2d\cos\theta/\sin^2\theta+h\sin\theta/\cos^2\theta=0$, then: $-2d\cos\theta/\sin^2\theta+h\sin\theta/\cos^2\theta=0$;

$h\sin\theta/\cos^2\theta=2d\cos\theta/\sin^2\theta$;

$\sin^3\theta/\cos^3\theta=2d/h$;

$\tan^3\theta=2d/h$;

That is, when $$\tan\theta = \sqrt[3]{2d/h},$$

$f(\theta)$ gets the extreme value in the range of $(0, \pi/2)$.

In addition, $f'(\theta)=-2d\cos\theta/\sin^2\theta+h\sin\theta/\cos^2\theta=(h\sin^3\theta-2d\cos^3\theta)/\sin^2\theta\cos^2\theta=\cos\theta(h\tan^3\theta-2d)/\sin^2\theta=(h\tan^3\theta-2d)/\sin\theta\tan\theta$;

Since in the range of $(0, \pi/2)$, $\sin\theta\tan\theta>0$, and when $$\tan\theta > \sqrt[3]{2d/h},$$

$f'(\theta)>0$; when $$\tan\theta < \sqrt[3]{2d/h},$$

$f'(\theta)<0$, so when $$\tan\theta = \sqrt[3]{2d/h},$$

$f(\theta)$ takes the minimum value in the range of $(0, \pi/2)$.

In summary, when the position of the reflective layer 140 and the position of the optical sensor 150 are arranged so that the incident angle $\theta$ of the emergent light 99 toward the reflective layer 140, the distance d between the light output surface of the light-emitting element and the center of the reflective layer in the first direction parallel to the base substrate, and the distance h between the light output surface of the light-emitting element and the optical sensor in the second direction perpendicular to the base substrate have a relationship of $2d/h=\tan 3\theta$, the absorption of the intensity of the emergent light 99 by various structures and components in the display device 100 may be further reduced to make the optical path of the emergent light 99 in the display device 100 the shortest, so that the aforementioned adjustment deviation reaches the minimum value, and then the controller 120 adjusts the light-emitting element 130 to achieve the best result, thereby enhancing the display quality.

According to some embodiments of the present disclosure, the size and setting position of the reflective layer 140 and the optical sensor 150 may also be determined according to the simulation of the light path of the emergent light 99. Specifically, the optical path is simulated by using ray optical module modeling in softwares specifically used for light path simulation, for example, comsol, ansys, etc., so as to determine the size, setting position and distribution of the reflective layer 140 and the size, setting position and distribution of the optical sensor 150.

According to some embodiments of the present disclosure, the reflective layer 140 may include a metal layer or a Bragg reflective layer. In some embodiments of the present disclosure, the material forming the metal layer may be aluminum, silver, or other kinds of metals with high reflectivity. As a result, materials are widely available, easily available, and cost-effective.

Figure 3:
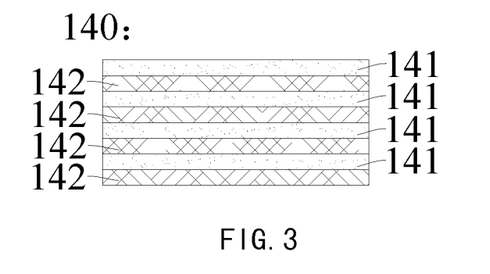
FIG. 3 shows a schematic cross-sectional structural view of a Bragg reflective layer according to other embodiments of the present disclosure.

According to some embodiments of the present disclosure, the Bragg reflective layer refers to a reflective film layer formed alternately by two materials with a large difference in refractive index, which may be formed of multiple layers of metal compounds and cryolite alternately stacked in sequence, wherein, the metal compound may be a metal compound such as zinc sulfide (ZnS) or molybdenum trioxide (MoO3). In some embodiments of the present disclosure, referring to FIG. 3, the reflective layer 140 is formed of first sub-reflective layers 141 and second sub-reflective layers 142 which are alternately stacked in sequence, and the first sub-reflective layers 141 and the second sub-reflective layers 142 are six layers in total, wherein the first the material of the first sub-reflective layer 141 may be zinc sulfide or molybdenum trioxide, and the material of the second sub-reflective layer 142 may be cryolite. In this case, the reflectivity of the reflective layer 140 may reach 85%; In some other embodiments, referring to FIG. 4, the reflective layer 140 is formed of first sub-reflective layers 141 and second sub-reflective layers 142 which are alternately stacked in sequence, forming the first sub-reflective layer, and the first sub-reflective layers 141 and the second sub-reflective layers 142 are eight layers in total, the materials of 141 and the second sub-reflective layer 142 are as described above. In this case, the reflectivity of the reflective layer 140 may reach 99%. When the emergent light 99 emitted by the light-emitting element 130 enters the reflective layer 140, it first enters the first sub-reflective layer 141 with a lower reflectivity, and then enters the second sub-reflective layer 142 with a higher reflectivity, so that the reflective layer 140 has a high reflectivity.

According to some embodiments of the present disclosure, the thickness of the reflective layer 140 may be 100 nm to 800 nm. For example, the thickness of the reflective layer 140 may be 100 nm, 200 nm, 300 nm, 400 nm, 500 nm, 600 nm, 700 nm, or 800 nm. Therefore, the thickness of the reflective layer 140 is equivalent to the wavelength of visible light, and may reflect the emergent light in the visible light band well, and is particularly suitable for display devices.

According to some embodiments of the present disclosure, the controller 120 can be used as long as it may be used to adjust the light-emitting intensity of the light-emitting element 130 to the ideal intensity according to the real-time intensity, and its specific type and electrical connection relationship with other components may be types and electrical connection relationships of conventional controllers, which will not be repeated here.

According to some embodiments of the present disclosure, a specific way in which the controller 120 adjusts the real-time intensity may be that the controller 120 recognizes the real-time intensity, detected by the optical sensor 150, of the reflective light incident onto the optical sensor 150 after the emergent light 99 emitted from the light emitting element 130 is reflected by the reflective layer 140, then the controller 120 determines the light-emitting intensity compensation parameter corresponding to the pixel unit P in the preset grayscale range to which the current grayscale belongs, according to the real-time intensity of light in the pixel unit P on the display device 100 driven by the current grayscale, and then the controller 120 adjusts the light-emitting intensity of the emergent light emitted from the light-emitting element 130 in the pixel according to the light-emitting intensity compensation parameter, so that the light-emitting intensity approaches the ideal intensity. In some embodiments of the present disclosure, the controller 120 may adjust the light-emitting intensity of all pixel units P in the display device 100 at the same time, or may adjust the light-emitting intensity of only some pixel units Pin the display device 100. For example, if the display device is an OLED display device, the light-emitting intensity of the light-emitting element in the OLED display device is controlled by the controller adjusting the current flowing through the light-emitting element. If the real-time intensity is weaker than the ideal intensity, the controller controls the current to increase, and if the real-time intensity is stronger than the ideal intensity, the controller controls the current to decrease. In other embodiments of the present disclosure, if the display device is an LCD display device, the controller controls the voltage to adjust the deflection of the liquid crystal so as to adjust the intensity of the light emitted by the light-emitting element. If the real-time intensity is weaker than the ideal intensity, the controller adjusts the voltage to control the deflection of the liquid crystal so that more light passes through the liquid crystal, and if the real-time intensity is stronger than the ideal intensity, the controller adjusts the voltage to control the deflection of the liquid crystal so that less light passes through the liquid crystal. Thus, the emergent light 99 emitted by the light-emitting element 130 in any pixel unit P of the display device 100 may be adjusted, so that the display performance of the display device 100 is better, and the process is simple and is easy to implement.

According to some embodiments of the present disclosure, after the optical sensor 150 measures the real-time intensity of the emergent light 99, the controller 120 reads the real-time intensity, and the controller 120 adjusts the real-time intensity through an optical compensation algorithm, so that the light-emitting intensity of the light-emitting element 130 approaches the ideal intensity.

According to some embodiments of the present disclosure, the optical sensor 150 may include structures and components of a conventional optical sensor 150 such as a photoelectric converter, a photodiode and so on. In the present disclosure, the connection relationships between the various structures and components in the optical sensor 150 are also the connection relationships between the various structures and components in the conventional optical sensor, which will not be repeated here.

According to some embodiments of the present disclosure, referring to FIGS. 4-8, the optical sensor 150 also requires an optical sensor driver 151 to drive the optical sensor 150 to work. In some embodiments of the present disclosure, the optical sensor driver 151 may be a thin film transistor, specifically, an oxide thin film transistor, or a low temperature polysilicon thin film transistor. Thus, the optical sensor 150 may measure the real-time intensity of the emitted light emitted by the light-emitting element well.

According to some embodiments of the present disclosure, the display panel 100 is, for example, an organic light-emitting display panel, which may be a bottom emission organic light-emitting display panel or a top emission organic light-emitting display panel. The solutions of the present disclosure have a wide range of applications.

Figure 4:
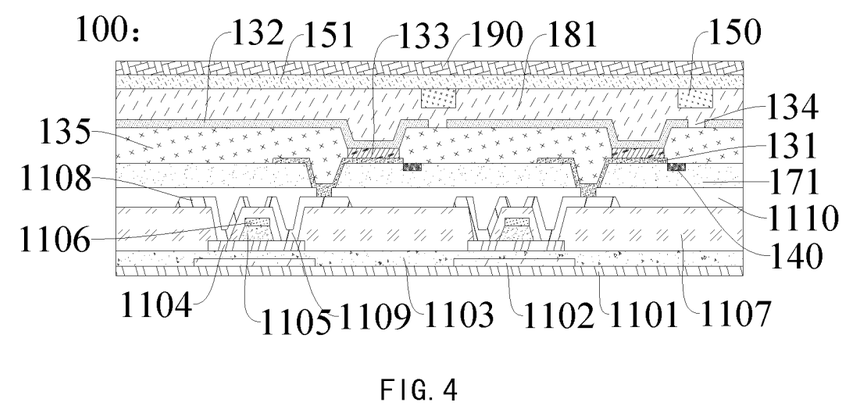
FIG. 4 shows a schematic cross-sectional structural view of a display panel according to some embodiments of the present disclosure.
Figure 5:
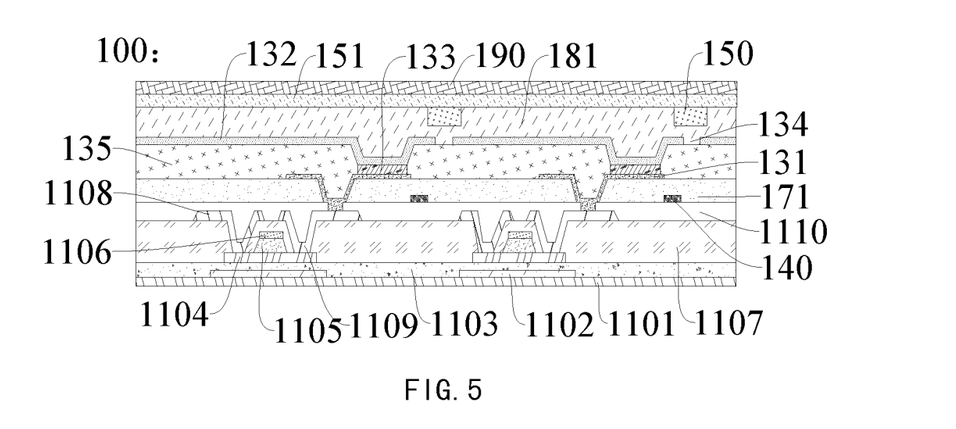
FIG. 5 shows a schematic cross-sectional structural view of a display panel according to some embodiments of the present disclosure.
Figure 6:
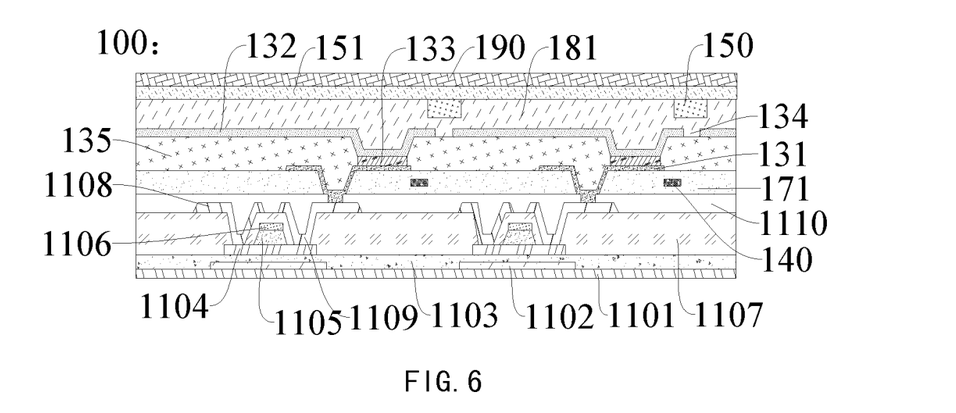
FIG. 6 shows a schematic cross-sectional structural view of a display panel according to some embodiments of the present disclosure.

In some embodiments of the present disclosure, FIGS. 4-6 are schematic cross-sectional structural views of display panels according to some embodiments of the present disclosure. The controller 120 is not shown in FIGS. 4-6. Referring to FIGS. 4, 5 and 6, The display panel 100 is a bottom emission organic light-emitting display panel, and the light-emitting element 130 includes a first electrode 131 (for example, an anode 131), a light-emitting layer 133, and a second electrode 132 (for example, a cathode 132) that are sequentially arranged away from the base substrate 1101. The first electrode 131 is a transparent electrode, and the second electrode 132 is a non-transparent electrode, for example, a reflective electrode, so that the light-emitting element 130 emits light toward the base substrate 1101, that is, the light output surface of the light-emitting element 130 faces the base substrate 1101. The display panel 100 includes a resin layer 171 located on a light output side of the light-emitting element 130 (it should be noted that in this context, the light output side refers to a side where the light-emitting element 130 emits light) and a first planarization layer 181 located on a backlight side of the light-emitting element (it should be noted that in this context, the backlight side refers to a side where the light-emitting element 130 does not emit light, that is, a side opposite to the light output side of the light-emitting element 130), The reflective layer 140 is embedded in the resin layer 171. In some embodiments, as shown in FIG. 4, the reflective layer 140 is embedded in the resin layer 171 and is located at a boundary of the resin layer 171 close to the first electrode 131. In some embodiments, as shown in FIG. 5, the reflective layer 140 is embedded in the resin layer 171, and is located at a boundary of the resin layer 171 away from the first electrode 13. In some embodiments, as shown in FIG. 6, the reflective layer 140 is embedded in the resin layer 171 and is located between the boundary of the resin layer 171 close to the first electrode 131 and the boundary of the resin layer 171 away from the first electrode 131. In the above embodiments, as shown in FIGS. 4-6, the optical sensor 150 is embedded in the first planarization layer 181 and is located at a boundary of the first planarization layer 181 away from the second electrode 132. Thus, the optical sensor 150 of the display panel 100 may measure the real-time intensity of the emergent light, so that real-time compensation for the emergent light of the light-emitting element 130 of the pixel unit P in the display panel 100 may be achieved, which overcomes the drawback that the display panel 100 has a poor display performance due to aging or defects during the operation process. As a result, the display panel 100 may still achieve a better display performance after being used for a long time. In addition, the reflective layer 140 is provided on the light output side of the light-emitting element, and the reflective layer 140 reflects the emergent light toward the optical sensor 150, so that the structure of the display panel 100 is simple, and there is no need to change the overall structure of the display panel 100. It is easy to implement in the process and easy for industrial production.

According to some embodiments of the present disclosure, referring to FIGS. 4, 5 and 6, in the bottom emission organic light-emitting display panel described in the present disclosure, the second electrodes 132 of adjacent pixel units P are connected to each other as an integral electrode layer. In the integral electrode layer, an opening 134 is provided at the position corresponding to the reflective layer 140 and the optical sensor 150, so that the light reflected by the reflective layer 140 is directed toward the optical sensor 150 through the opening 134. Thus, the process is simple, convenient, and it is easy to realize industrialization. In addition, compensation for the light emitted from the light-emitting element 130 of the pixel unit P in the display panel 100 may be achieved, which overcomes the drawback that the display panel 100 has a poor display performance due to aging or defects during the operation process. As a result, the display panel 100 may still achieve a better display performance after being used for a long time. The reflective layer 140 is provided in a light output direction of the light-emitting element, the emergent light is reflected by the reflective layer 140 to the optical sensor 150, so that the structure of the display panel 100 is simple, and there is no need to change the overall structure of the display panel 100.

According to some embodiments of the present disclosure, referring to FIGS. 4 to 6, the bottom emission organic light-emitting display panel described above may further include a light shielding layer 1102, a buffer layer 1103, an active layer 1104, and a gate insulating layer 1105, a gate electrode 1106, an interlayer dielectric layer 1107, a source electrode 1108, a drain electrode 1109, and the first protective layer 1110 provided on the base substrate 1101. In addition, the bottom emission organic light-emitting display panel may further include structures or components, such as a pixel defining layer 135, a cover plate 190, etc. The positional relationships and connection relationships between the above structures or components are the positional relationships and connection relationships between the structures or components in the conventional bottom emission organic light-emitting display panel, which will not be repeated here.

Figure 7:
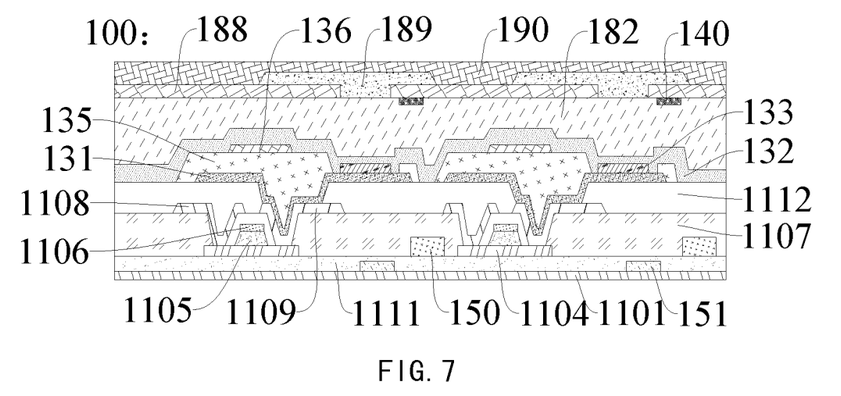
FIG. 7 shows a schematic cross-sectional structural view of a display panel according to some embodiments of the present disclosure.
Figure 8:
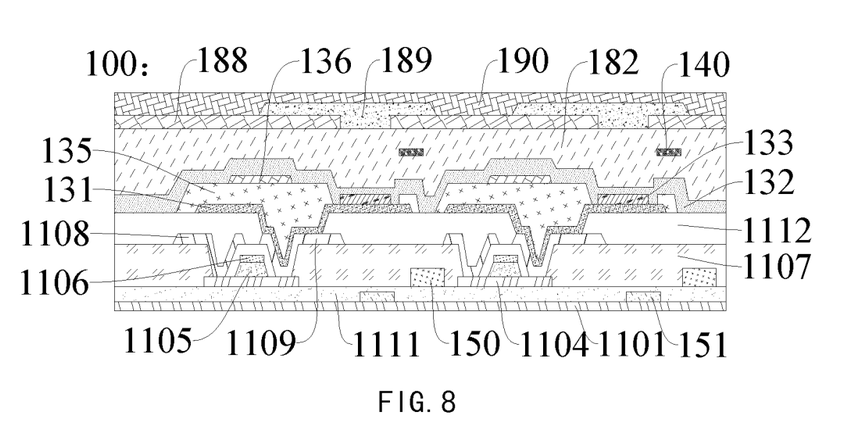
FIG. 8 shows a schematic cross-sectional structural view of a display panel according to some embodiments of the present disclosure.

In other embodiments of the present disclosure, FIGS. 7-8 are schematic cross-sectional structural views of display panels according to some embodiments of the present disclosure. The controller 120 is not shown in FIGS. 7-8. Referring to FIGS. 7 and 8, the display panel 100 is a top emission organic light-emitting display panel. The light-emitting element 130 includes a first electrode 131 (for example, an anode 131), a light-emitting layer 133, and a second electrode 132 (for example, a cathode 132), which are sequentially disposed away from the base substrate 1101. The first electrode 131 is a transparent electrode or a non-transparent electrode, and the second electrode 132 is a transparent electrode, so that the light-emitting element 130 emits light in a direction away from the base substrate 1101, that is, the light output surface of the light-emitting element 130 faces away from the base substrate 1101. The display panel 100 includes a second planarization layer 182 located on the light output side of the light-emitting element 130, and an interlayer dielectric layer 1107 on the backlight side of the light-emitting element, and the reflective layer 140 is embedded in the second planarization layer 182. In some embodiments, as shown in FIG. 7, the reflective layer 140 is embedded in the second planarization layer 182 and is located at a boundary of the second planarization layer 182 away from the second electrode 132. In some embodiments, as shown in FIG. 8, the reflective layer 140 is embedded in the second planarization layer 182 and is located between the boundary of the second planar layer 182 away from the second electrode 132 and boundary of the second planar layer 182 close to the second electrode 132. In the above embodiments, as shown in FIGS. 7-8, the optical sensor 150 is embedded in the interlayer dielectric layer 1107 and located at a boundary of the interlayer dielectric layer 1107 away from the first electrode 131. Therefore, the optical sensor 150 of the display panel 100 may measure the real-time intensity of the emitted light, so that real-time compensation for the emergent light of the light-emitting element 130 of the pixel unit P in the display panel 100 may be achieved, which overcomes the drawback that the display panel 100 has a poor display performance due to aging or defects during the operation process. As a result, the display panel 100 may still achieve a better display performance after being used for a long time. In addition, the reflective layer 140 is provided on the light output side of the light-emitting element 130, and the reflective layer 140 reflects the emergent light toward the optical sensor 150, so that the structure of the display panel 100 is simple, and there is no need to change the overall structure of the display panel 100. It is easy to implement in the process and easy for industrial production.

According to some embodiment of the present disclosure, referring to FIGS. 7 and 8, the top emission organic light-emitting display panel described above may further include an active layer 1104, a gate insulating layer 1105, and a gate 1106, a source electrode 1108, a drain electrode 1109, a second protective layer 1111 and a third protective layer 1112 provided on the base substrate 1101. In addition, the top emission organic light-emitting display panel may further include structures and components, such as a pixel defining layer 135, a spacer wall 136, a black matrix 188, a color film substrate 189, the cover plate 190 and the like. The positional relationships and connection relationships between the above structures or components are the positional relationships and connection relationships between the structures or components in the conventional top emission organic light-emitting display panel, which will not be repeated here.

In another aspect of the present disclosure, some embodiments of the present disclosure provide a method for manufacturing the display panel described above. The manufacturing method of the display panel includes the following steps:

forming a plurality of pixel units on the base substrate, and providing a controller.

The step of forming at least one pixel unit includes: forming a light-emitting element; forming a reflective layer on a light output side of the light-emitting element; and forming an optical sensor.

Wherein, the reflective layer is configured to receive and reflect light emitted by the light-emitting element to generate reflected light, the optical sensor is configured to receive the reflected light and measure the light intensity of the reflected light, and the controller is configured to adjust the light-emitting intensity of the light-emitting element based on the light intensity.

According to some embodiments of the present disclosure, those skilled in the art may understand that, for the convenience of process implementation, the specific step and sequence of forming the at least one pixel unit on the base substrate when the display panel is a bottom-emission organic light-emitting display panel are not completely the same as that when the display panel is a top-emission organic light-emitting display panel.

Figure 9:
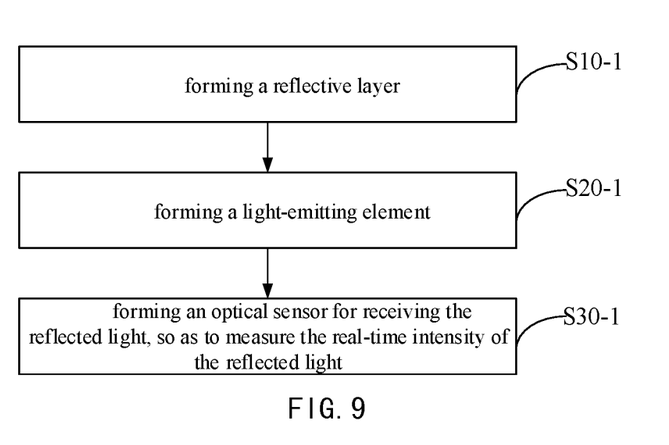
FIG. 9 shows a schematic flowchart of a method for manufacturing a pixel unit of a display panel according to some embodiments of the present disclosure.

In some embodiments of the present disclosure, the display panel is a bottom emission organic light-emitting display panel. Referring to FIG. 9, the method includes:

S10-1: forming a reflective layer.

According to some embodiments of the present disclosure, the manufacturing method of the reflective layer may be performed by steps such as deposition, exposure, development, and etching, and the process conditions and parameters of the steps of deposition, exposure, development, and etching may be the process conditions and parameters for conventional deposition, exposure, development and etching, which will not be repeated here.

S20-1: forming a light-emitting element.

According to some embodiments of the present disclosure, the methods and steps for forming the light-emitting element are conventional methods and steps for forming a light-emitting element, which will not be repeated here.

S30-1: forming an optical sensor for receiving the reflected light, so as to measure the real-time intensity of the reflected light.

According to some embodiments of the present disclosure, the manufacturing method of the optical sensor may be performed by steps of deposition, wet etching, or dry etching. The process conditions and parameters of the steps of deposition, wet etching, and dry etching may be process conditions and parameters of conventional deposition, wet etching and dry etching, which will not be repeated here.

Figure 10:
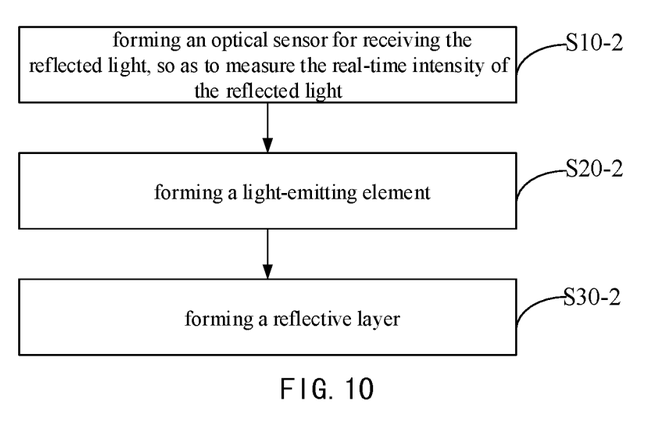
FIG. 10 shows a schematic flowchart of a method for manufacturing a pixel unit of a display panel according to other embodiments of the present disclosure.

In other embodiments of the present disclosure, the display panel is a top emission organic light-emitting display panel. Referring to FIG. 10, the method includes:

S10-2: forming an optical sensor for receiving the reflected light, so as to measure the real-time intensity of the reflected light.

According to some embodiments of the present disclosure, the manufacturing method of the optical sensor may be performed by steps of deposition, wet etching, and dry etching. The process conditions and parameters of the steps of deposition, wet etching, and dry etching may be conventional. The process conditions and parameters of deposition, wet etching and dry etching will not be repeated here.

S20-2: forming a light-emitting element.

According to the embodiments of the present disclosure, the methods and steps for forming the light-emitting element are conventional methods and steps for forming a light-emitting element, which will not be repeated here.

S30-2: forming a reflective layer.

According to some embodiments of the present disclosure, the manufacturing method of the reflective layer may be performed by steps such as deposition, exposure, development, and etching, and the process conditions and parameters of the steps of deposition, exposure, development, and etching may be the process conditions and parameters for conventional deposition, exposure, development and etching, which will not be repeated here.

Figure 11:
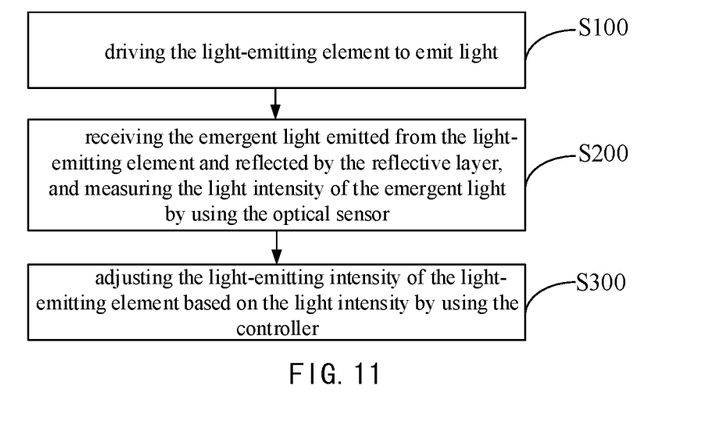
FIG. 11 shows a schematic flowchart of a method for driving a display panel according to some embodiments of the present disclosure.

In another aspect of the present disclosure, some embodiments of the present disclosure provide a method of driving the aforementioned display panel. According to some embodiments of the present disclosure, referring to FIG. 11, the method includes the following steps:

S100: driving the light-emitting element to emit light.

According to some embodiments of the present disclosure, the specific way of driving the light-emitting element to emit light is not particularly limited, and may be any known driving method. According to some embodiments of the present disclosure, in order to simplify the device structure, the controller is electrically connected to the light-emitting element, thereby the light-emitting element may be controlled to emit light by the controller. The operation is simple, convenient. It is easy to realize, and is easy to realize industrialized production.

S200: receiving the emergent light emitted from the light-emitting element and reflected by the reflective layer, and measuring the light intensity of the emergent light by using the optical sensor.

According to some embodiments of the present disclosure, the optical sensor may measure the real-time intensity of the emergent light in real time. The optical sensor may include the structures and components of a conventional optical sensor, such as a photoelectric converter and a photodiode. In some embodiments of the present disclosure, the connection relationships between various structures and components in the optical sensor are also the connection relationships between various structure and components in the conventional optical sensor, which will not be repeated here.

S300: adjusting the light-emitting intensity of the light-emitting element based on the light intensity by using the controller.

According to some embodiments of the present disclosure, the controller compares the real-time intensity with an ideal intensity, and adjusts the light-emitting intensity of the light-emitting element to approach the ideal intensity based on the comparison result, that is, adjusting the light-emitting intensity of the light-emitting element to be basically equal to the ideal intensity. According to some embodiments of the present disclosure, the controller may be used as long as it can be used to adjust the light-emitting intensity of the light-emitting element to approach the ideal intensity according to the real-time intensity, and its specific type and electrical connection relationship with other components may be types and electrical connection relationships of conventional controllers, which will not be repeated here.

According to some embodiments of the present disclosure, the manner in which the controller adjusts the light-emitting intensity of the light-emitting element may vary according to the type of display device. For example, if the display device is an OLED display device, the light-emitting intensity of the light-emitting element in the OLED display device is controlled by the controller adjusting the current flowing through the light-emitting element. If the real-time intensity is weaker than the ideal intensity, the controller controls the current to increase, and if the real-time intensity is stronger than the ideal intensity, the controller controls the current to decrease. In other embodiments of the present disclosure, if the display device is an LCD, the controller controls the voltage to adjust the deflection of the liquid crystal, so as to adjust the intensity of the light emitted by the light-emitting element. If the real-time intensity is weaker than the ideal intensity, the controller adjusts the voltage to control the deflection of the liquid crystal so that more light passes through the liquid crystal, and if the real-time intensity is stronger than the ideal intensity, the controller adjusts the voltage to control the deflection of the liquid crystal so that less light passes through the liquid crystal.

According to some embodiments of the present disclosure, the specific manner in which the controller adjusts the real-time intensity may be that the controller recognizes the real-time intensity, detected by the optical sensor, of the reflected light after the emergent light emitted from the light emitting element is reflected by the reflective layer, then the controller determines the light-emitting intensity compensation parameter corresponding to the pixel in the preset grayscale range to which the current grayscale belongs, according to the real-time intensity of light in the pixel unit on the display device driven by the current grayscale, and then the controller adjusts the light-emitting intensity of the emergent light emitted from the light-emitting element in the pixel according to the light-emitting intensity compensation parameter, so that the light-emitting intensity approaches the ideal intensity, that is, the light-emitting intensity is adjusted to be basically equal to the ideal intensity.

In some embodiments of the present disclosure, the controller may adjust the light-emitting intensity of all pixel units in the display device at the same time, or may adjust the light-emitting intensity of only some pixel units in the display device. The technical solution of the present disclosure may adjust the emergent light emitted by the light-emitting element in any pixel of the display device, so that the display performance of the display device is better, and the process is simple and easy to implement.

According to some embodiments of the present disclosure, the controller reads the real-time intensity, the controller compares the real-time intensity with the ideal intensity, and adjusts the real-time intensity through an optical compensation algorithm, so that the light-emitting intensity of the element approaches the ideal intensity. Thereby, the compensation of the emergent light emitted from the light-emitting element of the pixel unit may be achieved, which overcomes the drawback that the display panel has a poor display performance due to aging or defects during the operation process. As a result, the display panel may still achieve a better display performance after being used for a long time. The display device used has a simple structure without changing the overall structure of the display panel, which is easy to realize in process and easy for industrial production.

Adjusting the light-emitting intensity of the light-emitting element to approach the ideal intensity described above means adjusting the light-emitting element to a state in which the light-emitting intensity of the light-emitting element is substantially equal to the ideal intensity. A certain deviation is allowed between the adjusted light-emitting intensity and the ideal intensity (a deviation between the adjusted light-emitting intensity and the ideal intensity is within 5%), and they do not require complete consistency.

In summary, the above-mentioned embodiments of the present disclosure may achieve real-time compensation for the emergent light emitted from the light-emitting element of the pixel unit, which overcomes the drawback that the display panel has a poor display performance due to aging or defects during the operation process. As a result, the display panel may still achieve a better display performance after being used for a long time. The display device used has a simple structure without changing the overall structure of the display panel, which is easy to realize in process and easy for industrial production.

In the description of the present disclosure, it should be understood that the azimuth or positional relationship indicated by the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. is based on the azimuth or positional relationship shown in the drawings. It is merely for the convenience of describing the present disclosure and simplifying the description, rather than indicating or implying that the device or element referred to must have a specific orientation, be constructed and operate in a specific orientation, and therefore it should not be construed as limiting the present disclosure.

In addition, the terms "first" and "second" are used for description purposes only, and cannot be understood as indicating or implying relative importance or implicitly indicating the number of technical features indicated. Thus, the features defined by "first" and "second" may explicitly or implicitly include one or more of the features. In the description of the present disclosure, the meaning of "plurality" is two or more, unless otherwise specifically limited.

In this disclosure, unless otherwise clearly specified and limited, the terms "installation", "connection", "conjunction", "fixation" and other terms should be understood in a broad sense, for example, it can be a fixed connection or a detachable connection, or integration; it may be a mechanical connection or an electrical connection; it may be a direct connection or an indirect connection through an intermediation, and it may be the connection between insides of two components or the interaction relationship between two components. Those of ordinary skill in the art may understand the specific meanings of the above terms in the present disclosure according to specific situations.

In this disclosure, unless explicitly stated and defined otherwise, the first feature is "above" or "below" the second feature may be that the first and second features are in direct contact, or the first and second features may be indirectly contacted through an intermediary. Moreover, the first feature is "on", "above" and "over" the second feature may be that the first feature is directly above or obliquely above the second feature, or only means that the first feature is higher than the second feature. The first feature is "below", "under", and "underneath" the second feature may be that the first feature is directly below or obliquely below the second feature, or simply means that the first feature is lower than the second feature.

In the description of this specification, the description with reference to the terms "one embodiment", "some embodiments", "examples", "specific examples", or "some examples" means that the specific features, structures, materials or characteristics described in connection with the embodiments or examples are included in at least one embodiment or example of the present disclosure. In this specification, the schematic expression of the above terms does not necessarily refer to the same embodiment or example. Moreover, the specific features, structures, materials, or characteristics described may be combined in any suitable manner in any one or more embodiments or examples. In addition, without contradicting each other, those skilled in the art may combine different embodiments or examples and features of different embodiments or examples described in this specification.

Although the embodiments of the present disclosure have been shown and described above, it should be understood that the above-mentioned embodiments are exemplary and may not be construed as limitations to the present disclosure. Those of ordinary skill in the art can make changes, modifications, substitutions, and variations to the above-described embodiments within the scope of the present disclosure.

What is claimed is:

1. A display panel, comprising:
   a base substrate;
   a plurality of pixel units on the base substrate; and
   a controller,
   at least one pixel unit comprising:
   a light-emitting element;
   a reflective layer provided on a light output side of the light-emitting element and configured to receive and reflect light emitted by the light-emitting element to generate reflected light; and
   an optical sensor configured to receive the reflected light and measure a light intensity of the reflected light,
   wherein the controller is configured to adjust a light-emitting intensity of the light-emitting element based on the light intensity,
   wherein the light-emitting element comprises a light-emitting layer, an orthographic projection of the reflective layer on the base substrate does not overlap with an orthographic projection of the light-emitting layer on the base substrate.

2. The display panel according to claim 1, wherein the optical sensor is configured to receive the reflected light and measure a real-time light intensity of the reflected light, and the controller is configured to adjust the light-emitting intensity of the light-emitting element to be equal to an ideal intensity based on the real-time light intensity.

3. The display panel according to claim 1, wherein the reflective layer comprises a Bragg reflective layer, and the Bragg reflective layer comprises multiple layers of metal compounds and cryolite which are alternately stacked in sequence.

4. The display panel according to claim 1, wherein the optical sensor is provided on a side of the light-emitting element opposite to the light output side.

5. The display panel according to claim 1, wherein an orthographic projection of the optical sensor on the base substrate does not overlap with the orthographic projection of the light-emitting layer on the base substrate.

6. The display panel according to claim 1, wherein a light output surface of the light-emitting element is parallel to the reflective layer, and in a first direction parallel to the base substrate, a distance between the light output surface of the light-emitting element and a center of the reflective layer is d, wherein, $0 < d \le 200$ μm.

7. The display panel according to claim 1 wherein in a second direction perpendicular to the base substrate, a distance between a light output surface of the light-emitting element and the optical sensor is h, wherein, $0 < h \le 500$ μm.

8. The display panel according to claim 1, wherein a light output surface of the light-emitting element is parallel to the reflective layer, a light intensity of light emitted by the light-emitting element and incident onto a center of the reflective layer is in a predetermined proportion to a central light intensity of light emitted by the light-emitting element, an incident angle of the light emitted by the light-emitting element and incident onto the center of the reflective layer is θ, a distance, in a first direction parallel to the base substrate, between a light output surface of the light-emitting element and the center of the reflective layer is d, and a distance, in a second direction perpendicular to the base substrate, between the light output surface of the light-emitting element and the optical sensor is h, wherein $2d/h = \tan^3 \theta$.

9. The display panel according to claim 1, wherein the display panel is a bottom-emission display panel, the light-emitting element comprises a first electrode, the light-emitting layer, and a second electrode which are sequentially arranged away from the base substrate, the first electrode is a transparent electrode, the second electrode is a non-transparent electrode, and the display panel further comprises:
a resin layer between the base substrate and the first electrode; and
a first planarization layer on a side of the second electrode away from the base substrate.

10. The display panel according to claim 9, wherein the second electrodes in adjacent pixel units are connected to each other to form an integral electrode layer, and the integral electrode layer is provided with an opening so that light reflected by the reflective layer is allowed to pass through the opening to be incident onto the optical sensor.

11. The display panel according to claim 9, wherein the optical sensor is embedded in the first planarization layer and located at a boundary of the first planarization layer away from the second electrode.

12. The display panel according to claim 9, wherein the reflective layer is embedded in the resin layer and located at a boundary of the resin layer close to the first electrode.

13. The display panel according to claim 9, wherein the reflective layer is embedded in the resin layer and located at a boundary of the resin layer away from the first electrode.

14. The display panel according to claim 9, wherein the reflective layer is embedded in the resin layer, and is located between a boundary of the resin layer away from the first electrode and a boundary of the resin layer close to the first electrode.

15. The display panel according to claim 1, wherein the display panel is a top-emission display panel, the light-emitting element comprises a first electrode, the light-emitting layer, and a second electrode which are sequentially arranged away from the base substrate, the second electrode is a transparent electrode, and the display panel further comprises:
an interlayer dielectric layer between the base substrate and the first electrode; and
a second planarization layer on a side of the second electrode away from the base substrate.

16. The display panel according to claim 15, wherein the optical sensor is embedded in the interlayer dielectric layer and located at a boundary of the interlayer dielectric layer away from the first electrode.

17. The display panel according to claim 15, wherein the reflective layer is embedded in the second planarization layer and located at a boundary of the second planarization layer away from the second electrode.

18. The display panel according to claim 15, wherein the reflective layer is embedded in the second planarization layer, and is located between a boundary of the second planarization layer away from the second electrode and a boundary of the second planarization layer close to the second electrode.

19. A method for manufacturing a display panel, comprising:
forming a plurality of pixel units on a base substrate, and providing a controller,
the step of forming at least one pixel unit comprises:
forming a light-emitting element;
forming a reflective layer on a light output side of the light-emitting element; and
forming an optical sensor,
wherein the reflective layer is configured to receive and reflect light emitted by the light-emitting element to generate reflected light, the optical sensor is configured to receive the reflected light and measure a light intensity of the reflected light, and the controller is configured to adjust a light-emitting intensity of the light-emitting element based on the light intensity,
wherein the light-emitting element comprises a light-emitting layer, an orthographic projection of the reflective layer on the base substrate does not overlap with an orthographic projection of the light-emitting layer on the base substrate.

20. A method for driving a display panel, the display panel comprising:
a base substrate
a plurality of pixel units on the base substrate; and
a controller,
at least one pixel unit, comprising:
a light-emitting element comprising a light-emitting layer;
a reflective layer provided on a light output side of the light-emitting element and configured to receive and reflect light emitted by the light-emitting element to generate reflected light, wherein an orthographic projection of the reflective layer on the base substrate does not overlap with an orthographic projection of the light-emitting layer on the base substrate; and
an optical sensor, wherein the method comprises:
driving the light-emitting element to emit light;
receiving the reflected light and measuring a light intensity of the reflected light by using the optical sensor; and
adjusting a light-emitting intensity of the light-emitting element based on the light intensity by using the controller.

\* \* \* \* \*